(12) United States Patent
Lee et al.

(10) Patent No.: US 9,613,551 B2
(45) Date of Patent: Apr. 4, 2017

(54) ORGANIC LIGHT EMITTING DIODE DISPLAY APPARATUS AND METHOD AND APPARATUS FOR INSPECTING THE SAME

(71) Applicant: Samsung Display Co., Ltd., Yongin, Gyeonggi-Do (KR)

(72) Inventors: June-Woo Lee, Yongin (KR); Jae-Beom Choi, Yongin (KR); Kwan-Wook Jung, Yongin (KR); Sung-Soo Choi, Yongin (KR); Seong-Jun Kim, Yongin (KR); Guang-Hai Jin, Yongin (KR); Ga-Young Kim, Yongin (KR); Jee-Hoon Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 1175 days.

(21) Appl. No.: 13/670,195

(22) Filed: Nov. 6, 2012

(65) Prior Publication Data

US 2013/0293236 A1  Nov. 7, 2013

(30) Foreign Application Priority Data

May 4, 2012 (KR) .................. 10-2012-0047589

(51) Int. Cl.
*G09G 3/30* (2006.01)
*G09G 3/36* (2006.01)
(Continued)

(52) U.S. Cl.
CPC ........... *G09G 3/006* (2013.01); *G09G 3/3233* (2013.01); *G01R 31/025* (2013.01);
(Continued)

(58) Field of Classification Search
CPC ........ G09G 1/00; G09G 3/006; G09G 3/3233; G09G 2300/0852; G09G 2310/0262; G09G 2320/043; G01R 31/44; G01R 31/025
(Continued)

(56) References Cited

U.S. PATENT DOCUMENTS 7,394,446 B2 * 7/2008 Park ..................... G09G 3/3233
345/76
2007/0176623 A1 * 8/2007 Miyake ................ G09G 3/3648
324/760.02

FOREIGN PATENT DOCUMENTS

| JP | 2006-010496 A | 1/2006 |
| JP | 2007-078379 A | 3/2007 |
| KR | 10-2005-0065947 A | 6/2005 |

* cited by examiner

*Primary Examiner* — Farhana Hoque
(74) *Attorney, Agent, or Firm* — Knobbe Martens Olson & Bear LLP

(57) ABSTRACT

An organic light emitting diode display apparatus and a method and apparatus for easily inspecting the organic light emitting diode display apparatus to determine whether an electrical failure occurs. The organic light emitting diode display apparatus comprises a plurality of pixels each comprising a pixel electrode, an intermediate layer including an organic emission layer, and an opposite electrode; scan lines and data lines corresponding to the plurality of pixels; first power supply lines connected to the plurality of pixels and extending in a first direction; second power supply lines connected to the first power supply lines; and a control line unit for simultaneously supplying control signals to the plurality of pixels, the control line unit including a plurality of control lines extending in one direction and two common lines being respectively connected to both ends of each of the plurality of control lines.

23 Claims, 6 Drawing Sheets

(51) Int. Cl.
*G09G 3/00* (2006.01)
*G09G 3/3233* (2016.01)
*G01R 31/02* (2006.01)

(52) U.S. Cl.
CPC .............. *G09G 2300/0852* (2013.01); *G09G 2310/0262* (2013.01); *G09G 2320/043* (2013.01)

(58) Field of Classification Search
USPC ............................................ 324/414; 345/92
See application file for complete search history.

ORGANIC LIGHT EMITTING DIODE DISPLAY APPARATUS AND METHOD AND APPARATUS FOR INSPECTING THE SAME

CROSS-REFERENCE TO RELATED APPLICATIONS

This application claims the benefit of Korean Patent Application No. 10-2012-0047589, filed on May 4, 2012, in the Korean Intellectual Property Office, the disclosure of which is incorporated herein in its entirety by reference.

BACKGROUND

Field

The technical field relates to an organic light emitting diode display apparatus and a method and apparatus for inspecting the same, and more particularly, to an organic light emitting diode display apparatus that can be easily inspected to determine whether an electrical failure occurs and a method and apparatus for inspecting the organic light emitting diode display apparatus.

Description of the Related Technology

Recently, display apparatuses have been replaced with portable thin film flat panel display apparatuses. An organic light emitting diode display apparatus is a self-emitting display apparatus and has a larger viewing angle, better contrast characteristics, and a faster response speed, compared to other flat panel display apparatuses. Thus, the organic light emitting diode display apparatus has drawn attention as a next-generation display apparatus.

Generally, an organic light-emitting diode display apparatus includes an intermediate layer, a first electrode, and a second electrode. The intermediate layer includes an organic emission layer. When a voltage is applied to the first and second electrodes, visible light is emitted from the organic emission layer.

Various wires are installed in an organic light emitting diode display apparatus to drive the organic light emitting diode display apparatus. From among the various wires, some wires may be disposed on different layers to overlap with one another. When a short circuit failure occurs in regions where the wires overlap, the overlapping wires should be repaired.

However, it is not easy to detect a location of a short circuit failure occurring in such overlapping wire regions. In particular, as the number of wires increases and wires have a more complicated structure, inspecting an organic light emitting diode display apparatus becomes increasingly difficult.

SUMMARY OF CERTAIN INVENTIVE ASPECTS

One or more embodiments provide an organic light emitting diode display apparatus which can be easily inspected to determine whether an electrical failure occurs, and a method and apparatus for inspecting the organic light emitting diode display apparatus.

According to one embodiment, there is provided a method of inspecting an organic light emitting diode display apparatus which includes a plurality of pixels each including a pixel electrode, an intermediate layer including an organic emission layer, and an opposite electrode, scan lines and data lines corresponding to the plurality of pixels, first wires extending in a first direction; second wires connected to the first wires, and a conductive line unit including a plurality of conductive lines extending in one direction and two common lines being respectively connected to both ends of each of the plurality of conductive lines, the method including providing a power source; providing a first terminal and a second terminal that are connected to the power source; connecting the first terminal to the conductive line unit, and the second terminal to the first or second wires; and connecting an electric sensor to one of the conductive lines so as to sense current or voltage, and then supplying current to first terminal and the second terminal from the power source.

The electric sensor may be sequentially connected to the plurality of conductive lines and current may be supplied to the first terminal and the second terminal from the power source.

Whether a short circuit failure occurs between the conductive lines and the first wires or between the conductive lines and the second wires may be determined using a value sensed by the electric sensor.

The power source may be configured to supply a constant current.

The first wires may be first power supply lines connected to the pixel, and the second wires may be second power supply lines.

The conductive line unit may simultaneously supply control signals to the plurality of pixels, and the plurality of conductive lines may be control lines connected to the plurality of pixels.

According to one embodiment, there is provided an apparatus for inspecting an organic light emitting diode display apparatus which includes a plurality of pixels each including a pixel electrode, an intermediate layer including an organic emission layer, and an opposite electrode, scan lines and data lines corresponding to the plurality of pixels, first wires extending in a first direction; second wires connected to the first wires, and a conductive line unit including a plurality of conductive lines extending in one direction and two common lines being respectively connected to both ends of each of the plurality of conductive lines, the apparatus including a power source for supplying current; a first terminal and a second terminal that are connected to the power source; and an electric sensor for sensing current or voltage. The first terminal is connected to the conductive line unit, the second terminal is connected to the first or second wires, the electric sensor is connected to one of the conductive lines, and current is supplied from the power source via the first and second terminals.

The electric sensor may be sequentially connected to the plurality of conductive lines, and current may be supplied to first terminal and the second terminal from the power source.

The power source may be configured to supply a constant current.

The first wires may be first power supply lines connected to the pixel, and the second wires may be second power supply lines.

The conductive line unit may simultaneously supply control signals to the plurality of pixels, and the plurality of conductive lines may be control lines connected to the plurality of pixels.

According to another aspect of the present invention, there is provided an organic light emitting diode display apparatus including a plurality of pixels each including a pixel electrode, an intermediate layer including an organic emission layer, and an opposite electrode; scan lines and data lines corresponding to the plurality of pixels; first power supply lines connected to the plurality of pixels and extending in a first direction; second power supply lines connected to the first power supply lines; and a control line unit for simultaneously supplying control signals to the plurality of pixels, the control line unit including a plurality of control lines extending in one direction and two common lines being respectively connected to both ends of each of the plurality of control lines.

The second power supply lines may extend in a second direction perpendicular to the first direction.

The control lines may extend in the first direction.

The control lines may be disposed on a layer on which the first or second power supply voltages are not disposed. The first or second power supply voltages, which are disposed on the layer, on which the control lines are not disposed, may intersect the control lines.

The control lines may be disposed on a layer on which the first power supply lines are disposed, and may be disposed on a layer on which the second power supply lines are not disposed so as to intersect the second power supply voltages.

The control lines may be disposed on a layer on which the data lines are disposed.

The first power supply voltages may be disposed on a layer on which the data lines are disposed.

The second power supply lines may be disposed on a layer on which the scan lines are disposed.

Each of the plurality of pixels may include at least three thin film transistors and at least two capacitors.

The control line unit may be electrically connected to a gate electrode of one of the at least three thin film transistors.

At least one of the at least three thin film transistors may include an active layer, a first gate electrode layer, a second gate electrode layer formed on the first gate electrode layer, a source electrode, and a drain electrode. The pixel electrode may be formed on a layer on which the first gate electrode layer is formed by using a material used to form the first gate electrode layer.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF CERTAIN INVENTIVE EMBODIMENTS

Hereinafter, exemplary embodiments will be described in greater detail with reference to the accompanying drawings.

As used herein, the term "and/or" includes any and all combinations of one or more of the associated listed items. Expressions such as "at least one of," when preceding a list of elements, modify the entire list of elements and do not modify the individual elements of the list.

Figure 1:
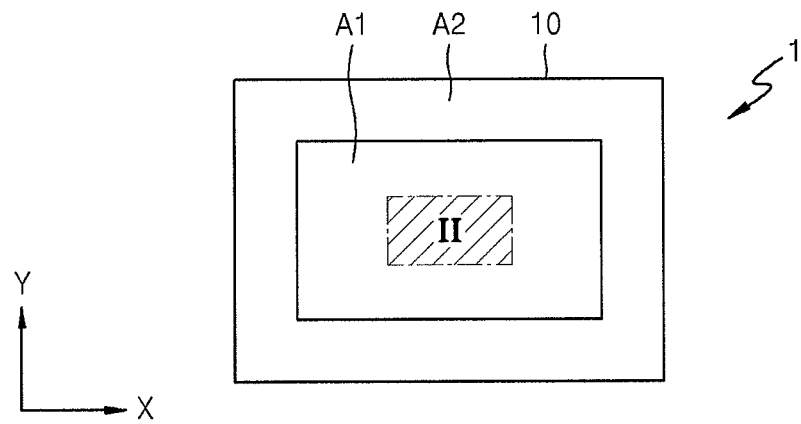
FIG. 1 is a schematic plan view of an organic light emitting diode display apparatus.
Figure 2:
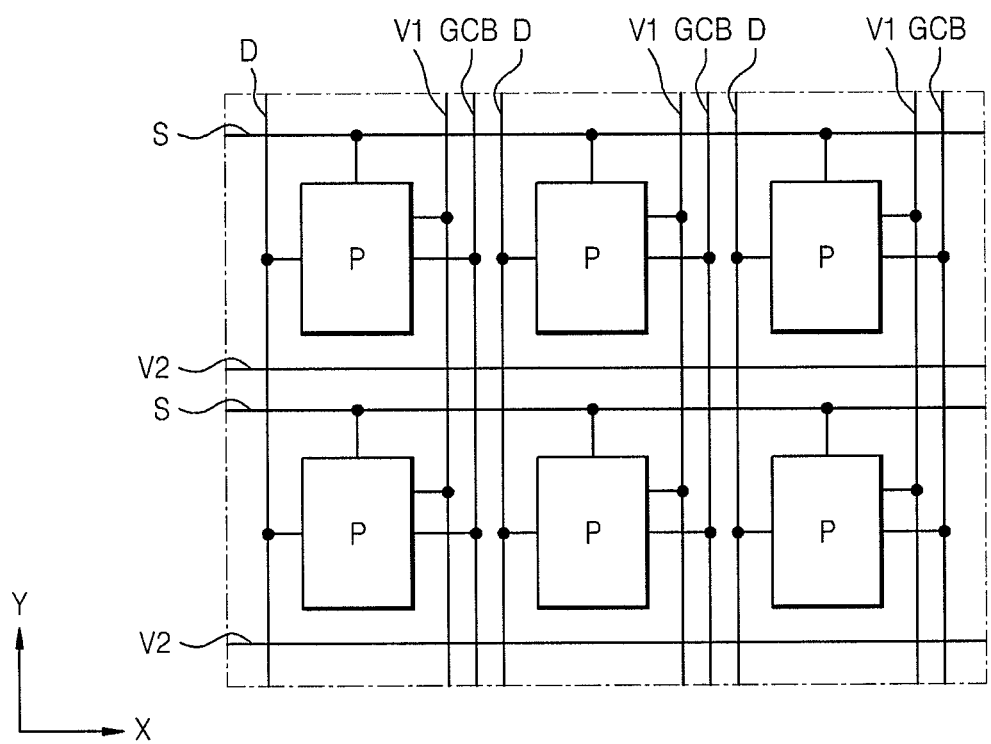
FIG. 2 is a diagram schematically illustrating a structure of wires included in a region II of FIG. 1.

FIG. 1 is a schematic plan view of an organic light emitting diode display apparatus 1. FIG. 2 is a diagram schematically illustrating a structure of wires included in a region II of FIG. 1.

Referring to FIGS. 1 and 2, in the organic light emitting diode display apparatus 1 according to the current embodiment, a display region A1 and a non-display region A2 are formed on a substrate 10.

The display region A1 displays an image therein and may be disposed in a region of the substrate 10 including a center of the substrate 10. The non-display region A2 may be disposed on the substrate 10 to surround the display region A1.

A plurality of pixels P forming an image are included in the display region A1.

The plurality of pixels P may be defined as scan lines S extending in a first direction (X-axis direction) and data lines D extending in a second direction (Y-axis direction) perpendicular to the first direction (X-axis direction). A data signal provided from a data driver (not shown) included in the non-display region A2 is supplied to the plurality of pixels P via the data lines D, and a scan signal provided from a scan driver (not shown) included in the non-display region A2 is supplied to the plurality of pixels P via the scan lines S. Although FIG. 2 illustrates that the data lines D extend in the second direction and the scan lines S extend in the first direction, the present embodiment is not limited thereto. In other words, the directions in which the data lines D and the scan lines S respectively extend may be switched with each other.

The plurality of pixels P are connected to first power supply lines V1 extending in the second direction (Y-axis direction). A first power supply voltage ELVDD (see FIG. 3) provided from a first power supply driver (not shown) included in the non-display region A2 is applied to the plurality of pixels P via the first power supply lines V1. Although not shown in FIG. 2, a power supply voltage ELVSS (see FIG. 3) is applied to the plurality of pixels P. The plurality of pixels P control the amount of current supplied to a power supply voltage source ELVSS(t) from the first power supply voltage ELVDD via an organic light emitting diode (OLED) of FIG. 3, according to a data signal. Then, OLED generates light having a desired brightness.

Second power supply lines V2 extending in the first direction (X-axis direction) are connected to the first power supply lines V1. A voltage drop (IR drop) may occur in the first power supply voltages line V1 due to resistance when the first power supply lines V1 are long. This problem may be solved by connecting the second power supply lines V2 to the first power supply lines V1.

The first and second power supply lines V1 and V2 may be connected according to any of various methods. For example, the first and second power supply lines V1 and V2 may be connected via contact holes.

Each of the plurality of pixels P is connected to one of control lines GCB of a control line unit. In other words, the plurality of pixels P are connected to the control lines GCB that branch off from one wire and that extend in the second direction. The control line unit including the control lines GCB is described in detail with reference to FIG. 4 below.

Control signals having a predetermined voltage provided from a control signal driver (not shown) included in the non-display region A2 are simultaneously applied to the plurality of pixels P via the control lines GCB.

Figure 3:
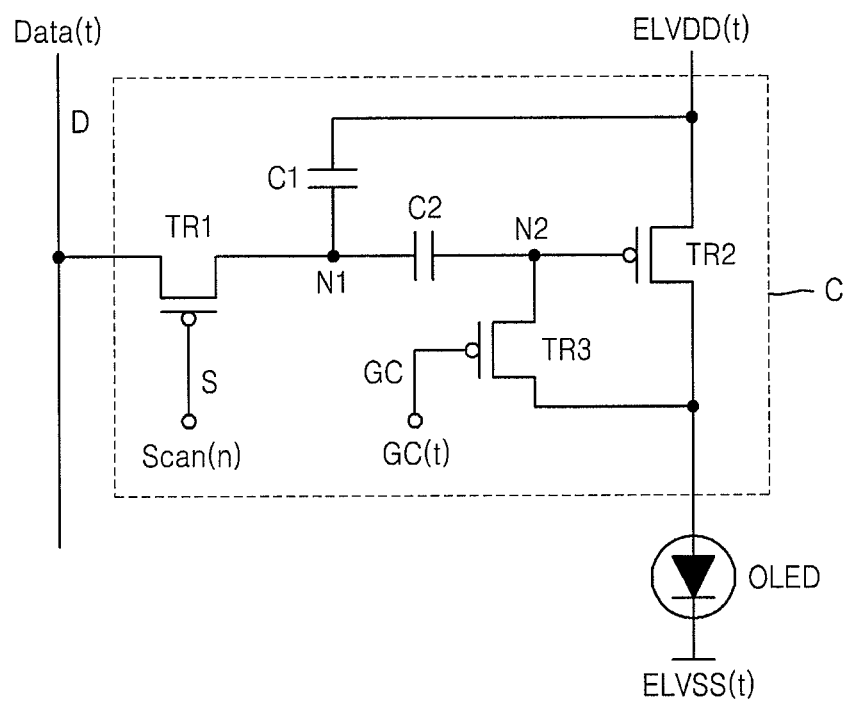
FIG. 3 is a circuit diagram of one of pixels included in the organic light emitting diode display apparatus of FIG. 1.

FIG. 3 is a circuit diagram of one of pixels included in the organic light emitting diode display apparatus 1 of FIG. 1.

Referring to FIG. 3, the pixel includes the OLED, and a pixel circuit C for supplying current to the OLED.

In the OLED, a pixel electrode is connected to the pixel circuit C and an opposite electrode is connected to the power supply voltage source ELVSS(t). The OLED generates light having a brightness corresponding to current supplied from the pixel circuit C.

An active matrix organic light emitting diode display apparatus includes two transistors and one capacitor. In detail, the active matrix organic light emitting diode display apparatus includes a switching transistor for delivering a data signal, a driving transistor for driving an organic light emitting device according to the data signal, and a capacitor for maintaining a data voltage constant.

In such an organic light emitting diode display apparatus including two transistors and one capacitor, power consumption is low, but the intensity of current flowing through an organic light emitting device may vary according to a deviation in a voltage between a gate and source of a driving transistor that drives the organic light emitting diode, i.e., a deviation in a threshold voltage of the driving transistor. Thus, display quality may be degraded. To solve this problem, at least three transistors or at least two capacitors may be included in an organic light emitting diode display apparatus.

In the organic light emitting diode display apparatus 1 according to the current embodiment, each of pixels may include three transistors TR1 to TR3 and two capacitors C1 and C2.

In the first transistor TR1, a gate electrode is connected to a scan line S, a first electrode is connected to a data line D, and a second electrode is connected to a first node N1. That is, a scan signal Scan(n) is supplied to the gate electrode of the first transistor TR1 and a data signal Data(t) is supplied to the first electrode of the first transistor TR1.

In the second transistor TR2, a gate electrode is connected to a second node N2, a first electrode is connected to a first power supply voltage source ELVDD(t), and a second electrode is connected to the pixel electrode of the OLED. The second transistor TR2 acts as a driving transistor.

The first capacitor C1 is connected between the first node N1 and the first electrode of the second transistor TR2, i.e., the first power supply voltage source ELVDD(t). The second capacitor C2 is connected between the first node N1 and the second node N2.

In the third transistor TR3, a gate electrode is connected to a control line unit GC, a first electrode is connected to the gate electrode of the second transistor TR2, and a second electrode is connected to the pixel electrode of the OLED, i.e., the second electrode of the second transistor TR2. Thus, a control signal GC(t) is supplied to the gate electrode of the third transistor TR3.

Although FIG. 3 illustrates a case where each of pixels includes three transistors and one capacitor, the present invention is not limited thereto. In other words, in order to compensate for a threshold voltage, more than three transistors and/or more than one capacitor may be included in each of pixels of an organic light emitting diode display apparatus.

Figure 4:
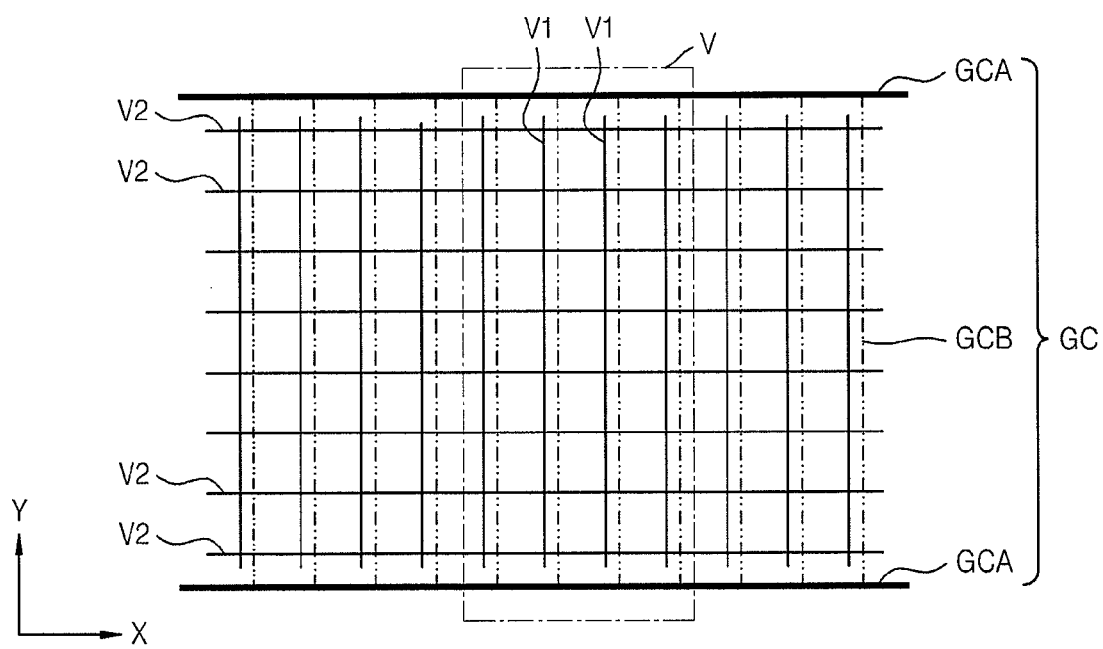
FIG. 4 is a diagram schematically illustrating some wires included in the organic light emitting diode display apparatus of FIG. 1.

FIG. 4 is a diagram schematically illustrating some wires included in the organic light emitting diode display apparatus 1 of FIG. 1, according to an embodiment of the present invention. For convenience of explanation, only a control line unit GC, first power supply lines V1, and second power supply lines V2 are illustrated in FIG. 4.

The control line unit GC includes a common line GCA and a plurality of control lines GCB. As described above, the control lines GCB extend in a second direction (Y-axis direction) to supply a control signal to pixels. The control lines GCB are connected to two common lines GCA. That is, the two common lines CGA are connected to both ends of each of the control lines GCB, respectively. For example, the two common lines GCA are disposed to be connected to an upper portion and a lower portion of each of the control lines GCB, respectively.

Thus, signals that branch off from a common signal received via the upper or lower common line of the two common lines GCA may be supplied to the control lines GCB. Since a signal may be selectively supplied to one of the two common lines GCA, the degree of freedom in designing wires for the organic light emitting diode display apparatus 1 may be improved. Furthermore, a signal having stable and uniform characteristics may be supplied to the control lines GCB.

The first power supply lines V1 and the second power supply lines V2 are connected to each other. Specifically, the first power supply lines V1 and the second power supply lines V2 may be formed on different layers to be connected to each other via a contact hole (not shown).

The control line GCB is formed on a layer that is different from a layer on which the first power supply lines V1 or the second power supply lines V2 are formed. In the current embodiment, the control line GCB and the second power supply lines V2 are formed on different layers. To this end, at least one insulating layer may be disposed between the control line GCB and the second power supply lines V2.

During manufacture of the organic light emitting diode display apparatus 1, the control lines GCB and the second power supply lines V2 formed on different layers may be connected to one another due to undesired particles. In particular, the control lines GCB and the second power supply lines V2 may be connected to one another in regions where the second power supply lines V2 and the control line unit GC overlap with one another, thereby causing a short circuit failure to occur, as will be described with reference to FIG. 5 below.

Figure 5:
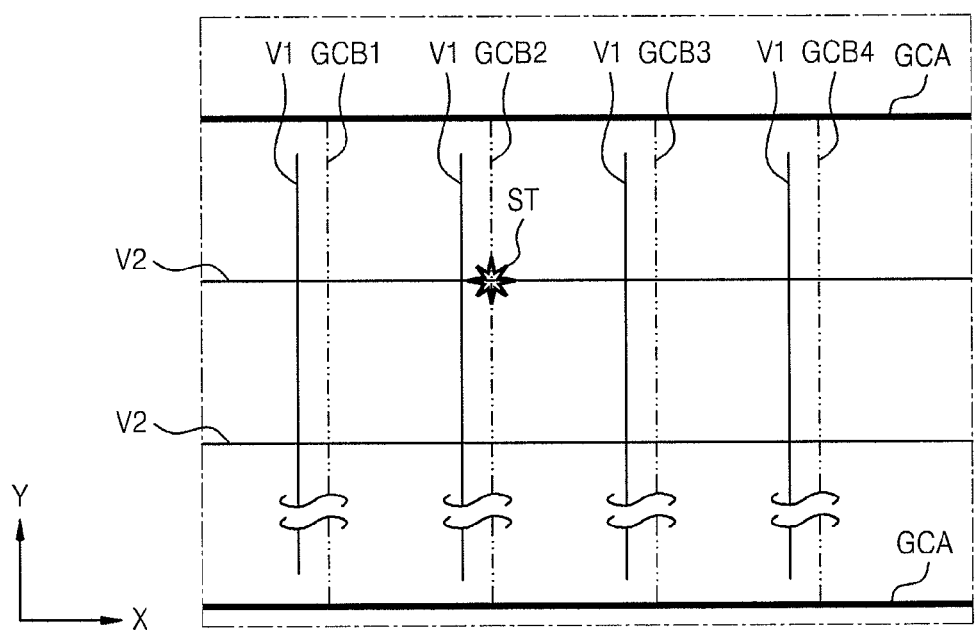
FIG. 5 is an enlarged view of a region V of FIG. 4.

FIG. 5 is an enlarged view of a region V of FIG. 4. Referring to FIG. 5, a short circuit failure ST occurs in a region where one control line CGB1 of the control line unit GC overlaps with a second power supply line V2, due to foreign substances, e.g., undesired particles. To improve image quality of the organic light emitting diode display apparatus 1, a repair process is performed to rectify the short circuit failure ST. To perform the repair process, a process of detecting a location of the short circuit failure ST should be first performed.

Figure 6A:
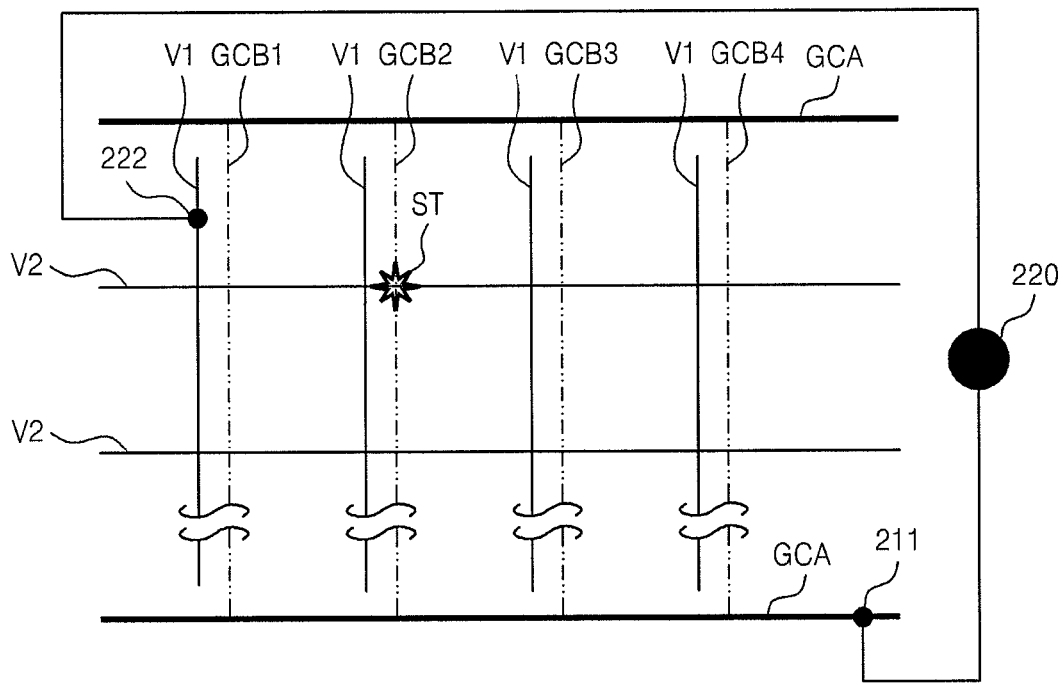
FIGS. 6A to 6C are diagrams schematically illustrating a method of inspecting an organic light emitting diode display apparatus.
Figure 6B:
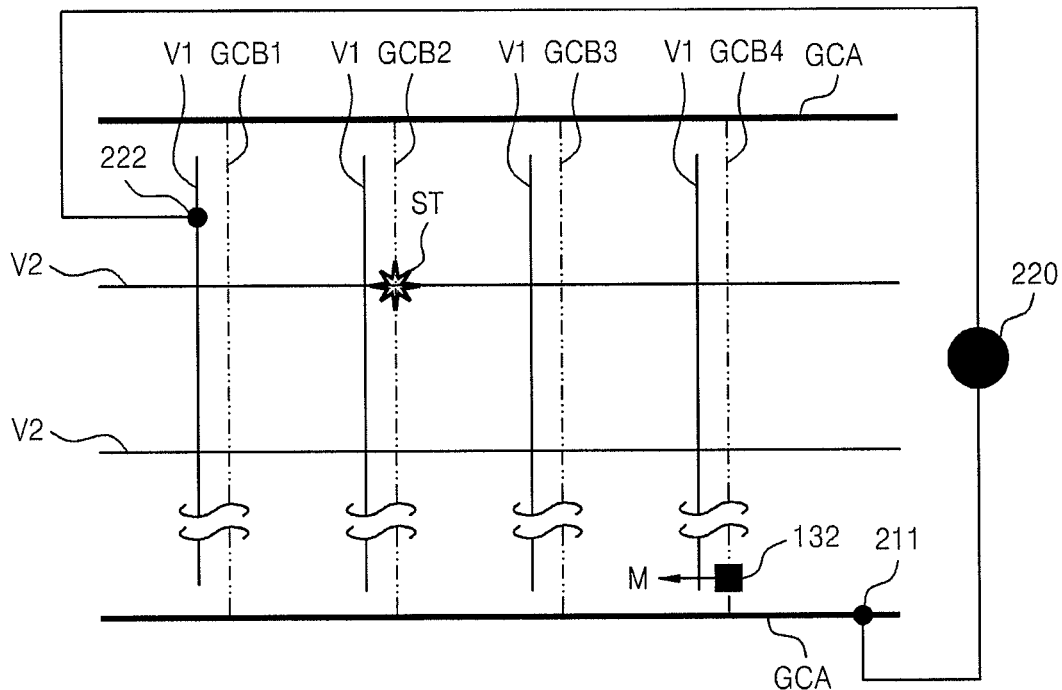
Figure 6C:
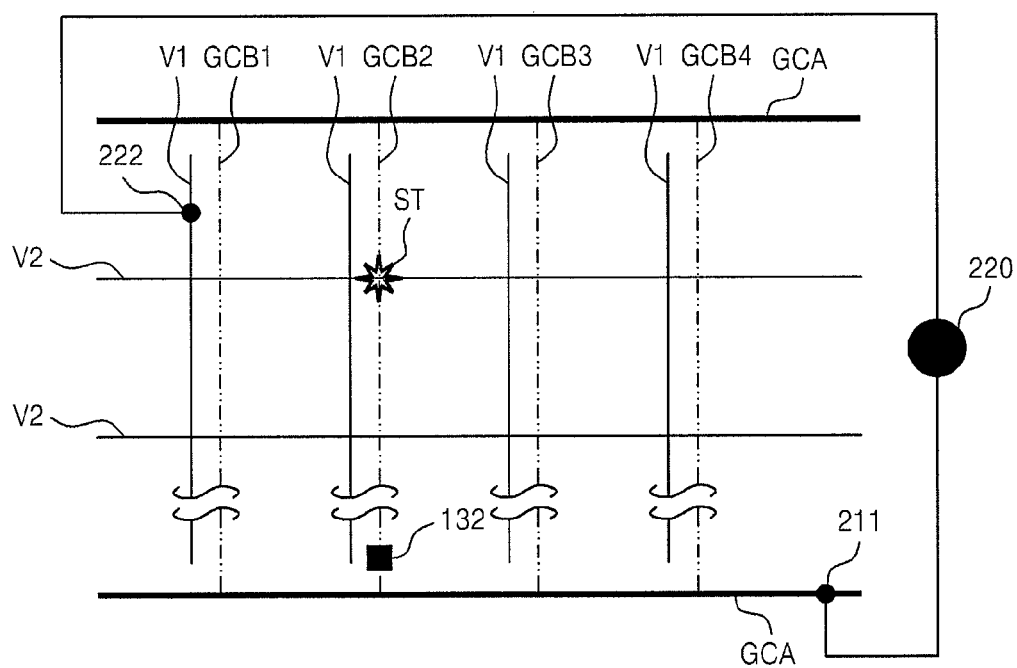

FIGS. 6A to 6C are diagrams schematically illustrating a method of inspecting an organic light emitting diode display apparatus, according to an embodiment of the present invention.

Referring to FIG. 6A, a power source 220, a first terminal 211, and a second terminal 222 are prepared. The power source 220 is formed to supply a constant amount of current via the first and second terminals 211 and 222.

The first terminal 211 connected to the power source 220 is connected to a control line unit GC (not shown). In detail, the first terminal 211 may be connected to one of common lines CGA of the control line unit GC.

The second terminal 222 connected to the power source 220 is connected to a first or second power supply line V1 or V2. Although FIG. 6A illustrates that the second terminal 222 is connected to a first power supply line V1, the present embodiment is not limited thereto and the second terminal 222 may be connected to a second power supply line V2.

Then, referring to FIG. 6B, an electric sensor 132 is prepared to sense current or voltage. If first and second power supply lines V1 and V2 are connected in a mesh fashion, then current may flow through all the first and second power supply lines V1 and V2 when a voltage is applied to inspect the organic light emitting diode display apparatus. Thus, the electric sensor 132 is connected to one of the control lines GCB to easily detect a short circuit failure.

As described above, the control lines GCB are formed on a layer on which the second power supply lines V2 are not formed. Also, as illustrated in FIG. 6B, the control lines GCB are not connected to the first power supply lines V1. Thus, when current is supplied to the first and second terminals 211 and 222 from the power source 220, the current supply is discontinued unless a short circuit failure occurs.

However, referring to FIG. 6B, when a short circuit failure ST occurs in a region where a control line GCB2 and one of the second power supply lines V2 overlap with each other, the current is continuously supplied. In this case, when the electric sensor 132 is connected to a control line GCB4 as illustrated in FIG. 6B, the electric sensor 132 may sense the current or a voltage generated due to the flow of the current.

Then, the electric sensor 132 is sequentially connected to the other control lines GCB1, GCB3, and GCB4 by moving the electric sensor 132 in a direction indicated with an arrow M. When the electric sensor 132 is connected to the control line GCB2 as illustrated in FIG. 6C, the electric sensor 13 senses the current or a voltage. In this case, since the short circuit failure ST occurs in the region where the control line GCB2 and the second power supply line V2 overlap with each other, a value measured by the electric sensor 132 connected to the control line GCB2 is remarkably different from those measured by the other control lines GCB1, GCB3, and GCB4. Thus, it is possible to exactly detect the control line GCB2 in which the short circuit failure ST occurs.

After the control line GCB2 in which the short circuit failure ST is sensed, a repair process including laser cutting is performed on the control line GCB2.

In the current embodiment, the first and second power supply lines V1 and V2 are described as wires connected in the mesh fashion but the present disclosure is not limited thereto. In other words, the present disclosure may be applied to various types of wires connected in the mesh fashion, e.g., control line units formed in the mesh fashion or auxiliary wires formed in the mesh fashion to reduce a resistance value of a cathode.

The control line unit GC has been described above as wires connected in the mesh fashion, but the present disclosure is not limited thereto. That is, the structure of the control line unit GC is not limited provided that it includes a plurality of conductive lines and two common lines being respectively connected to both ends of each of the plurality of conductive lines. For example, power supply wires may be formed as described above.

Figure 7:
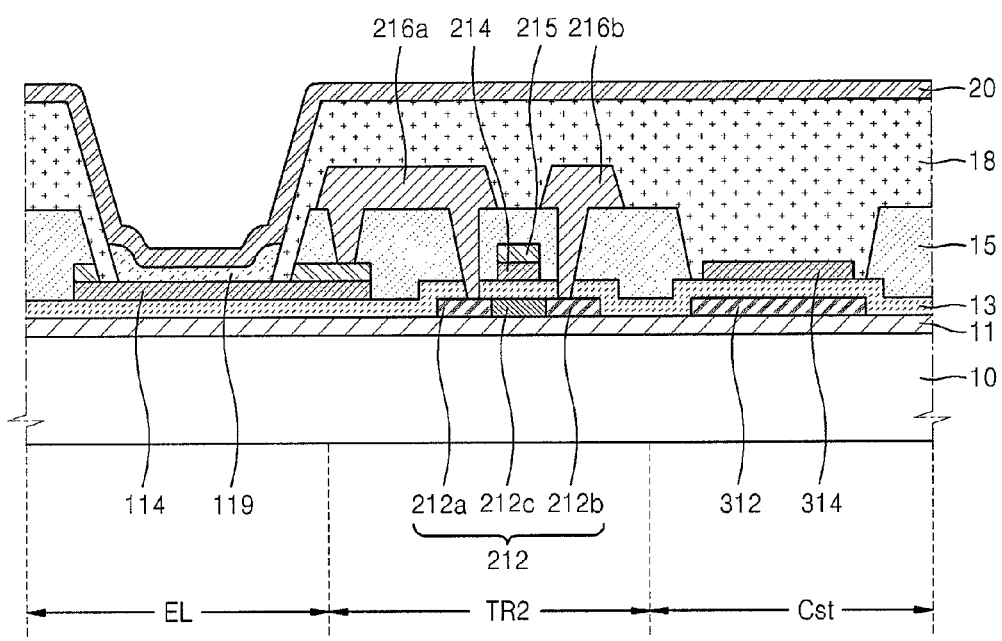
FIG. 7 is a cross-sectional view of some elements of each pixel of the organic light emitting diode display apparatus of FIG. 1.

FIG. 7 is a cross-sectional view of some elements of each pixel of the organic light emitting diode display apparatus of FIG. 1.

Referring to FIG. 7, a second transistor TR2 which is a thin film driving transistor, a first capacitor Cst, and an organic light emitting device EL are disposed on a substrate 10. As described above, each pixel may include a first transistor TR1, a third transistor TR3, a second capacitor C2, and various wires, e.g., a scan line S, a data line D, first and second power supply lines V1 and V2, and a control line unit GC, but only some elements of each pixel are illustrated in FIG. 7 for convenience of explanation.

The substrate 10 may be formed of a $SiO_2$-based transparent glass material, but is not limited thereto and may be formed of a transparent plastic material.

A buffer layer 11 may further be disposed on the substrate 10. The buffer layer 11 provides a flat surface on the substrate 10 and protects the substrate 10 against moisture and foreign substances.

An active layer 212 of the second transistor TR2 is formed on the buffer layer 11. The active layer 212 may be formed of an inorganic semiconductor, e.g., amorphous silicon or poly silicon. Otherwise, the active layer 212 may be formed of an organic semiconductor, an oxide semiconductor, or any of other various materials. The active layer 212 includes a source region 212b, a drain region 212a, and a channel region 212c.

A gate insulating layer 13 is disposed on the active layer 212. A first gate electrode layer 214 and a second gate electrode layer 215 that contain a transparent conductive material are sequentially disposed on a location on the gate insulating layer 13 corresponding to the channel region 212c of the active layer 212.

A source electrode 216b and a drain electrode 216a are formed on the second gate electrode layer 215 between patterns of an interlayer insulating layer 15 to be connected to the source region 212b and the drain region 212a of the active layer, respectively.

A pixel defining layer 18 is formed on the interlayer insulating layer 15 to cover the source electrode 216b and the drain electrode 216a.

Although not shown in FIG. 7, the first transistor TR1 and the third transistor TR3 may have the same structure as that of the second transistor TR2.

In this case, the data line D may be formed on a layer where the source electrode 216b or the drain electrode 216a is disposed by using a material used to form the source electrode 216b or the drain electrode 216a. Similar to the data line D, control lines GCB of the control line unit GC may be formed on the layer where the source electrode 216b or the drain electrode 216a is disposed by using the material used to form the source electrode 216b or the drain electrode 216a. The first power supply line V1 may also be formed on the layer where the source electrode 216b or the drain electrode 216a is disposed by using the material used to form the source electrode 216b or the drain electrode 216a.

The scan line S may be formed on a layer where the first gate electrode layer 214 or the second gate electrode layer 215 is disposed by using a material used to form the first gate electrode layer 214 or the second gate electrode layer 215. Similar to the scan line S, the second power supply line V2 may be formed on the layer where the first gate electrode layer 214 or the second gate electrode layer 215 is disposed by using the material used to form the first gate electrode layer 214 or the second gate electrode layer 215.

A pixel electrode 114 is formed on the buffer layer 11 and the gate insulating layer 13 by using a transparent conductive material used to form the first gate electrode layer 214. The transparent conductive material may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

An intermediate layer 119 including an organic emission layer is formed on the pixel electrode 114.

The organic emission layer of the intermediate layer 119 may be formed of a low-molecular weight organic material or a high-molecular weight organic material. If the low-molecular weight organic material is used, then a hole transport layer (HTL), a hole injection layer (HIL), an electron transport layer (ETL), and an electron injection layer (EIL) may be stacked around the organic emission layer. In addition, other various layers may further be stacked if needed. In this case, examples of an organic material, such as copper phthalocyanine (CuPc), N'-Di (naphthalene-1-yl)-N, N'-diphenyl-benzidine (NPB), and tris-8-hydroxyquinoline aluminum (Alq3), may be used.

If the high-molecular weight organic material is used, the intermediate layer 119 may include not only the organic emission layer but also an HTL. The HTL may be poly-(3, 4)-ethylene-dihydroxy thiophene (PEDOT) or polyaniline (PANI). In this case, an organic material, e.g., a polyphenylenevinylene (PPV)-based high-molecular weight organic material or a polyfluorene-based high-molecular weight organic material, may be used.

An opposite electrode 20 is formed as a common electrode on the intermediate layer 119. In the case of the organic light emitting diode display apparatus according to the current embodiment, the pixel electrode 114 may function as an anode and the opposite electrode 20 may function as a cathode, or vice versa.

The opposite electrode 20 may be a reflective electrode containing a reflective material. In this case, the opposite electrode 20 may include at least one material selected from the group consisting of aluminum (Al), magnesium (Mg), lithium (Li), calcium (Ca), lithium fluoride/calcium (LiF/Ca), and lithium fluoride/aluminum (LiF/Al).

A lower electrode 312 and an upper electrode 314 of the first capacitor C1 are formed on the substrate 10 and the buffer layer 11. The lower electrode 312 is formed of a material used to form the active layer 212 of the second transistor TR2 which is a thin film driving transistor. The upper electrode 314 includes a transparent conductive material formed of a material used to form the pixel electrode 114. The gate insulating layer 13 is disposed between the lower electrode 312 and the upper electrode 314.

Although not shown in FIG. 7, a sealing member (not shown) may be disposed on the opposite electrode 20 to face one surface of the substrate 10. The sealing member is formed to protect the intermediate layer 119 from external moisture, oxygen, or the like. The sealing member may be formed of glass or plastic or may have a structure in which organic materials and inorganic materials overlap with one another.

According to the above embodiments, an organic light emitting diode display apparatus may be easily inspected to determine whether an electrical failure occurs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of inspecting an organic light emitting diode display apparatus the method comprising:
   providing an organic light emitting diode display apparatus comprising:
      a plurality of pixels each including a pixel electrode;
      an intermediate layer comprising an organic emission layer, and an opposite electrode;
      scan lines and data lines corresponding to the plurality of pixels;
      first wires extending in a first direction;
      second wires connected to the first wires; and
      a conductive line unit comprising a plurality of conductive lines extending in one direction and two common lines being respectively connected to both ends of each of the plurality of conductive lines;
   providing a power source;
   providing a first terminal and a second terminal that are connected to the power source;
   connecting the first terminal to the conductive line unit, and the second terminal to the first or second wires; and
   connecting an electric sensor to one of the conductive lines so as to sense current or voltage, and then supplying current to first terminal and the second terminal from the power source.

2. The method of claim 1, wherein the connecting an electric sensor to one of the conductive lines comprises sequentially connecting the electric sensor to the plurality of conductive lines and current is supplied to the first terminal and the second terminal from the power source.

3. The method of claim 1, further comprising determining whether a short circuit failure occurs between the conductive lines and the first wires or between the conductive lines and the second wires using a value sensed by the electric sensor.

4. The method of claim 1, wherein the power source is configured to supply a constant current.

5. The method of claim 1, wherein the first wires are first power supply lines connected to the pixel and the second wires are second power supply lines.

6. The method of claim 1, wherein the conductive line unit simultaneously supplies control signals to the plurality of pixels, and wherein the plurality of conductive lines are control lines connected to the plurality of pixels.

7. An apparatus for inspecting an organic light emitting diode display apparatus comprising a plurality of pixels each including a pixel electrode, an intermediate layer including an organic emission layer, and an opposite electrode, scan lines and data lines corresponding to the plurality of pixels, first wires extending in a first direction; second wires connected to the first wires, and a conductive line unit including a plurality of conductive lines extending in one direction and two common lines being respectively connected to both ends of each of the plurality of conductive lines, the apparatus comprising:
   a power source for supplying current;
   a first terminal and a second terminal connected to the power source; and
   an electric sensor for sensing current or voltage; and
   wherein the first terminal is connected to the conductive line unit;
   the second terminal is connected to the first or second wires;
   the electric sensor is connected to one of the conductive lines; and
   current is supplied from the power source via the first and second terminals.

8. The apparatus of claim 7, wherein the electric sensor is configured to be sequentially connected to the plurality of conductive lines, and the power source is configured to supply current to the first terminal and the second terminal.

9. The apparatus of claim 7, wherein the power source is configured to supply a constant current.

10. The apparatus of claim 7, wherein the first wires are first power supply lines connected to the pixel and the second wires are second power supply lines.

11. The apparatus of claim 7, wherein the conductive line unit is configured to simultaneously supply control signals to the plurality of pixels; and
wherein the plurality of conductive lines are control lines connected to the plurality of pixels.

12. An organic light emitting diode display apparatus comprising:
a plurality of pixels each comprising:
a pixel electrode;
an intermediate layer including an organic emission layer; and
an opposite electrode;
scan lines and data lines corresponding to the plurality of pixels;
first power supply lines connected to the plurality of pixels extending in a first direction;
second power supply lines connected to the first power supply lines; and
a control line unit for simultaneously supplying control signals to the plurality of pixels, wherein the control line unit comprises a plurality of control lines extending in one direction and two common lines being respectively connected to both ends of each of the plurality of control lines.

13. The organic light emitting diode display apparatus of claim 12, wherein the second power supply lines extend in a second direction perpendicular to the first direction.

14. The organic light emitting diode display apparatus of claim 12, wherein the control lines extend in the first direction.

15. The organic light emitting diode display apparatus of claim 12, wherein the control lines are disposed on a layer on which the first or second power supply voltages are not disposed, and
the first or second power supply voltages, which are disposed on the layer on which the control lines are not disposed, intersect the control lines.

16. The organic light emitting diode display apparatus of claim 12, wherein the control lines are disposed on a layer on which the first power supply lines are disposed, and are disposed on a layer on which the second power supply lines are not disposed so as to intersect the second power supply voltages.

17. The organic light emitting diode display apparatus of claim 12, wherein the control lines are disposed on a layer on which the data lines are disposed.

18. The organic light emitting diode display apparatus of claim 12, wherein the first power supply voltages are disposed on a layer on which the data lines are disposed.

19. The organic light emitting diode display apparatus of claim 12, wherein the second power supply lines are disposed on a layer on which the scan lines are disposed.

20. The organic light emitting diode display apparatus of claim 12, wherein each of the plurality of pixels comprises at least three thin film transistors and at least two capacitors.

21. The organic light emitting diode display apparatus of claim 20, wherein the control line unit is electrically connected to a gate electrode of at least one of the at least three thin film transistors.

22. The organic light emitting diode display apparatus of claim 20, wherein at least one of the at least three thin film transistors comprises:
an active layer;
a first gate electrode layer;
a second gate electrode layer formed on the first gate electrode layer;
a source electrode, and
a drain electrode; and
wherein the pixel electrode is formed on a layer on which the first gate electrode layer is formed by using a material used to form the first gate electrode layer.

23. The organic light emitting diode display apparatus of claim 12, wherein the control line unit further comprises a power supply connected to one of the first or second power supply lines and to one of the two common lines.

* * * * *